United States Patent [19]
Karlsson et al.

[11] Patent Number: 6,090,713
[45] Date of Patent: Jul. 18, 2000

[54] SHALLOW TRENCH ISOLATION FORMATION WITH SIMPLIFIED REVERSE PLANARIZATION MASK

[75] Inventors: Olov Karlsson, San Jose; Christopher F. Lyons, Fremont, both of Calif.; Basab Bandyophadhyay, Austin, Tex.; Nick Kepler, Saratoga, Calif.; Larry Wang, San Jose, Calif.; Effiong Ibok, Sunnyvale, Calif.

[73] Assignee: Advanced Micro Devices, Inc., Sunnyvale, Calif.

[21] Appl. No.: 08/992,491

[22] Filed: Dec. 18, 1997

[51] Int. Cl.[7] ................................. H01L 21/316
[52] U.S. Cl. .................. 438/691; 438/692; 438/694; 438/695; 438/697
[58] Field of Search ..................... 438/691, 700, 438/740, 744, 743, 751, 633, 424

[56] References Cited

U.S. PATENT DOCUMENTS

| | | | |
|---|---|---|---|
| 5,298,110 | 3/1994 | Schoenborn et al. | 156/626 |
| 5,362,669 | 11/1994 | Boyd et al. | 437/67 |
| 5,459,096 | 10/1995 | Venkatesan et al. | 437/67 |
| 5,492,858 | 2/1996 | Bose et al. | 437/67 |
| 5,494,857 | 2/1996 | Cooperman et al. | 437/228 |
| 5,792,707 | 8/1998 | Chung | 438/633 |
| 5,930,645 | 7/1999 | Lyons et al. | 438/424 |

*Primary Examiner*—Benjamin L. Utech
*Assistant Examiner*—Lan Vinh

[57] ABSTRACT

An insulated trench isolation structure with large and small trenches of differing widths is formed in a semiconductor substrate using a simplified reverse source/drain planarization mask. Embodiments include forming trenches and refilling them with an insulating material which also covers the substrate surface, polishing to remove an upper portion of the insulating material and to planarize the insulating material above the small trenches, depositing a second, thin layer of insulating material filling seams in the insulating material above the small trenches, masking the insulating material above the large trenches, isotropically etching, and polishing to planarize the insulating material. Since the insulating material is partially planarized and the seams over the small trenches are filled, etching can be carried out after the formation of a relatively simple planarization mask over only the large trenches, and not the small trenches. The use of a planarization mask having relatively few features with relatively large geometry avoids the necessity of creating and implementing a complex, critical mask, thereby reducing manufacturing costs and increasing production throughput.

14 Claims, 7 Drawing Sheets

SHALLOW TRENCH ISOLATION FORMATION WITH SIMPLIFIED REVERSE PLANARIZATION MASK

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions in which individual circuit components are formed. The electrical isolation of these active regions is typically accomplished by forming field oxide regions by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material such as silicon dioxide derived from tetraethyl orthosilicate (TEOS) to form a field oxide region. The insulating material is then planarized, as by chemical-mechanical polishing (CMP) using the barrier nitride layer as a polish stop, to remove all the oxide over the active regions so that only the trenches are filled. The nitride and pad oxide are stripped off the active areas to complete the trench isolation structure.

The planarization of the insulating material is a difficult process, because the field oxide regions vary largely in size. For example, one trench may have a width as little as $0.25\mu$, while an adjacent trench may be several microns wide. After the insulating material is deposited to fill the trenches and cover the polish stop, fissures called "seams" exist in the deposited insulating material above the smaller trenches, and indentations called "steps" exist in the upper surface of the insulating material above the large trenches, which steps are considerably deeper and wider than the seams. The presence of both seams and steps is problematic during polishing, in that the large amount of polishing required to remove the seams over the small features results in the removal of too much insulating material over the large features. This overpolishing of the insulating material above the large trenches produces undesirable "dishing" of the insulating material, resulting in a nonplanar insulating surface.

The problem of simultaneously planarizing an insulating material over both large and small features has been addressed by providing preliminary masking and etching steps, and then polishing, as by CMP. This technique is illustrated in FIGS. 1A–1C. Adverting to FIG. 1A, there is schematically illustrated the substrate 11, pad oxide layer 12, polish stop 13, oxide liner 14, trenches 15, insulating material 16, seams 17 and steps 18. Inverse source/drain photoresist mask 19 is formed on the insulating layer 16 to protect the seams 17 and steps 18 from overetching. Isotropic etching is then performed to remove most of the insulating material in the active areas (FIG. 1B) before the final chemical-mechanical polish, as shown in FIG. 1C.

Disadvantageously, the inverse source/drain mask 19 is a "critical mask"; i.e., it is, extremely complex and difficult to design and use. Its creation requires a complicated algorithm to calculate the location of the steps and seams and to provide protective masking over them, since even seams over the smallest features must be protected while etching. Moreover, the complexity of the mask and its small features challenges the capabilities of the photolithographic process necessary to implement the mask, thereby increasing manufacturing costs and reducing production throughput. As design rules are reduced to as small as $0.18\mu$ or less, the inverse source/drain mask becomes even more difficult and costly to design and use.

Accordingly, there exists a need for a method of manufacturing a semiconductor device with shallow trench isolation without the necessity of employing a complex critical mask for planarizing the field oxide.

SUMMARY OF THE INVENTION

An object of the present invention is a method of manufacturing a semiconductor device having insulated trenches formed in a semiconductor substrate, wherein an insulating material which fills the trenches and acts as the field oxide is planarized using a simplified inverse source/drain mask.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention. the foregoing and other objects are achieved in part by a method of manufacturing a semiconductor device having a plurality of trenches formed in a semiconductor substrate or in an epitaxial layer on the semiconductor substrate, which method comprises: forming a pad oxide layer on a main surface of the substrate or epitaxial layer; forming a polish stop layer having an upper surface on the pad oxide layer; forming a large trench and a small trench, the large trench having a width at the main surface greater than a width at the main surface of the small trench; depositing a first layer of an insulating material to fill the trenches and cover the polish stop layer, whereby the first insulating layer has a seam above the small trench, performing a first polish to substantially planarize a portion of the first layer of the insulating material above the small trench; depositing a second layer of the insulating material filling the seam; masking the large trench with a planarization mask having an opening above the small trench; etching to remove a portion of each of the first and second layers of the insulating material above the small trench; removing the planarization mask; and performing a second polish to planarize such that the upper surface of the first layer of the insulating material is substantially flush with the upper surface of the polish stop layer.

Another aspect of the present invention is a method of manufacturing an integrated circuit, comprising: forming a silicon oxide pad layer on a main surface of the substrate or an epitaxial layer formed on the substrate; forming a silicon nitride polish stop layer having an upper surface on the silicon oxide pad layer; providing a photoresist source/drain mask on the silicon nitride polish stop layer, the source/drain mask containing a pattern having a plurality of openings; etching to remove portions of the underlying nitride polish stop and pad oxide layers and to form a large trench and a small trench the large trench having a width at the main surface greater than a width at the main surface of the small trench; thermally growing a thin silicon oxide layer lining each trench; depositing a first layer of an insulating material to fill the trenches and cover the silicon nitride polish stop layer, the first layer of the insulating material comprising silicon dioxide derived from tetraethyl orthosilicate (TEOS) by low pressure chemical vapor deposition (LPCVD), silicon dioxide derived from silane by LPCVD, or a high density plasma oxide, whereby the first layer of the insulating material has a seam above the small trench; performing a first polish by chemical-mechanical polishing (CMP) to substantially planarize a portion of the first layer of the insulating material above the small trench; depositing a second layer of the insulating material to fill the seam and to cover the upper surface of the first layer of the insulating material; masking the large trench with a photoresist planarization mask having an opening above the small trench; isotropically etching to remove a portion of each of the first and second layers of the insulating material above the silicon nitride polish stop layer and the small trench; removing the planarization mask; and performing a second polish by CMP to planarize such that the upper surface of the first layer of the insulating material is substantially flush with the upper surface of the silicon nitride polish stop layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
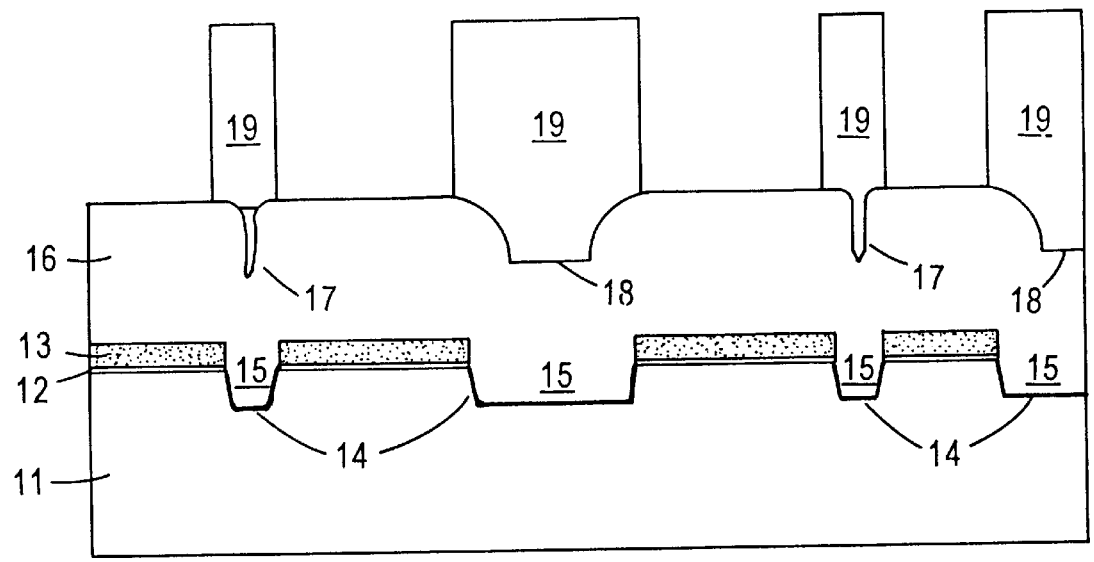
FIGS. 1A–1C schematically illustrate sequential phases of a complex method of STI formation.
Figure 1B:
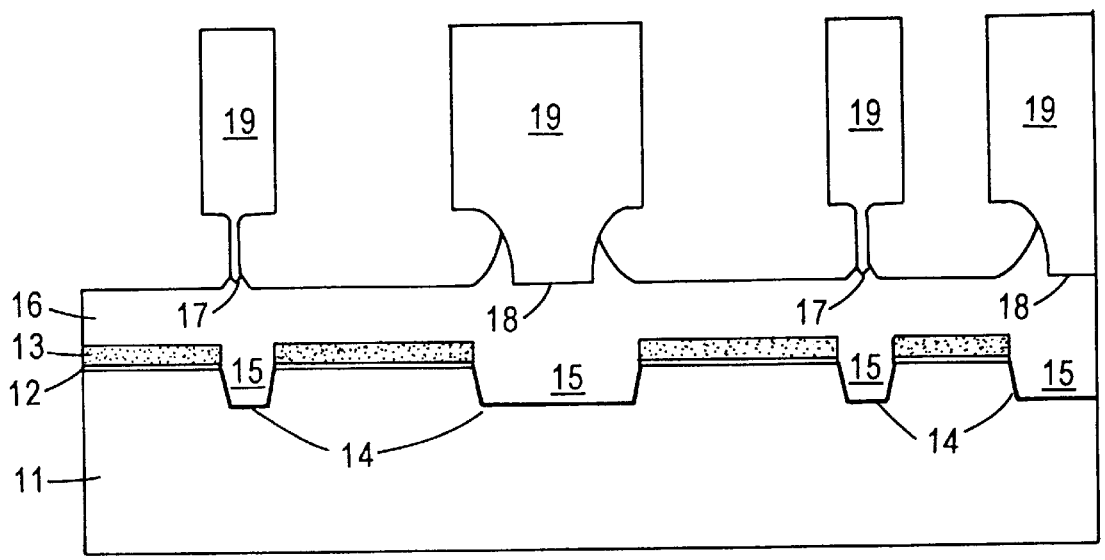
Figure 1C:
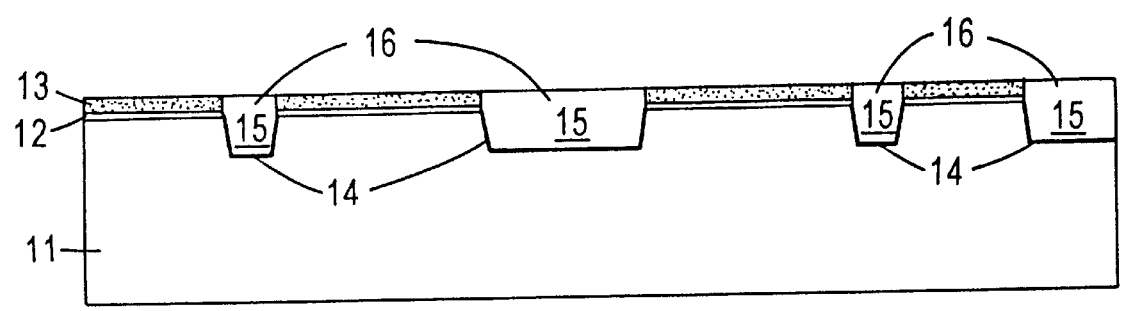

The use of a critical mask to planarize insulating material filling the trenches disadvantageously increases manufacturing costs and reduces production throughput. The present invention addresses and solves such problems by enabling the use of a simplified mask during planarization.

According to the methodology of the present invention, a source/drain photoresist mask is formed on a polish stop layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form large and small trenches, the large trenches being wider than the small trenches. An oxide liner is grown in each trench, and a first layer of insulating material is deposited to fill the trench and cover the polish stop layer. A seam is generally formed in the deposited insulating material above each of the small trenches, and a step is formed in the deposited insulating material above each of the large trenches. The insulating material is then polished, as by CMP, to remove extreme high points in the insulating material and to planarize the insulating material above the small trenches. A second layer of insulating material, thinner than the first layer of insulating material, is then deposited to fill the seams. Since deposition of insulating material is performed on a relatively planar surface and the second insulating layer is relatively thin, no new seams are formed with the second insulating layer. Thus, the second insulating layer effectively covers the seams formed in the first insulating layer. A photoresist planarization mask is thereafter formed on the second insulating layer above the large trenches and isotropic etching is conducted to remove additional insulating material. The planarization mask is then removed and polishing is conducted until reaching the polish stop, as by CMP.

The inventive methodology provides for filling the seams over the small trenches prior to etching to prevent overetching of the seams, thereby enabling etching to be carried out after the formation of a relatively simple planarization mask over only the large trenches; i.e., it is not necessary to locate and mask the small trenches. Thus, the necessity for a complex critical mask is avoided. The inventive planarization mask is easier to design and implement than inverse source/drain planarization masks, because it has fewer features, and its features have a relatively large geometry. Moroever, since the insulating material is partially removed before the etching step (during the first polish), the duration and extent of the subsequent etching and polishing steps are reduced. Thus, the present invention avoids the necessity to create and implement a critical mask as in conventional practices, thereby reducing the duration of the etching and final polishing operations, consequently enabling manufacturing costs to be reduced and production throughput to be increased.

Figure 2A:
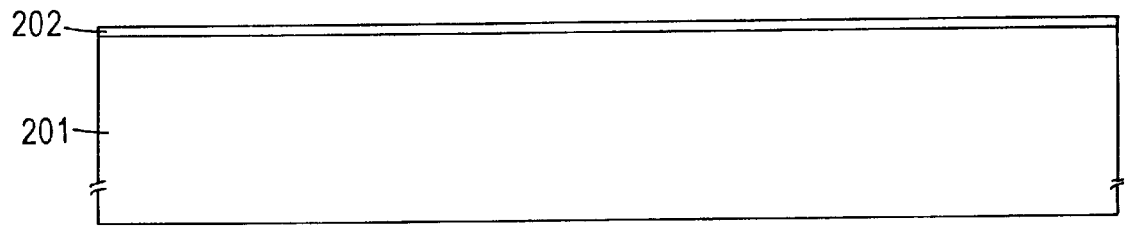
FIGS. 2A–2K schematically illustrate sequential phases of a method in accordance with an embodiment of the present invention.

An embodiment of the present invention is illustrated in FIGS. 2A–2K. wherein sequential phases in forming a semiconductor device in accordance with the present invention are depicted. Referring to FIG. 2A, substrate 201 is prepared having a substantially planar surface, typically a semiconductor substrate comprising doped monocrystalline silicon or an epitaxial layer formed on a semiconductor substrate in accordance with conventional practices. A pad oxide layer 202 is then grown on the substrate 201. Pad oxide layer 202 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer. FIG. 2A illustrates silicon substrate 201 and the pad oxide layer 202.

Figure 2B:
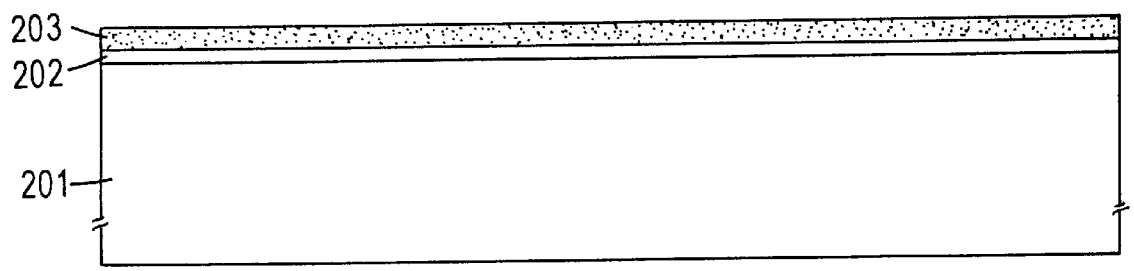

After formation of the pad oxide layer 202, a polish stop layer 203 is deposited on the pad oxide layer 202, as shown in FIG. 2B, such as a silicon nitride layer by CVD. Silicon oxide pad layer 202 functions as a buffer layer cushioning stresses between substrate 201 and polish stop layer 203. Polish stop layer 203 functions as an oxidation mask, as it is resistant to the diffusion of oxygen and water vapor therethrough, thereby preventing an oxidizing species from reaching the underlying silicon substrate, as well as acting as a polish stop.

Figure 2C:
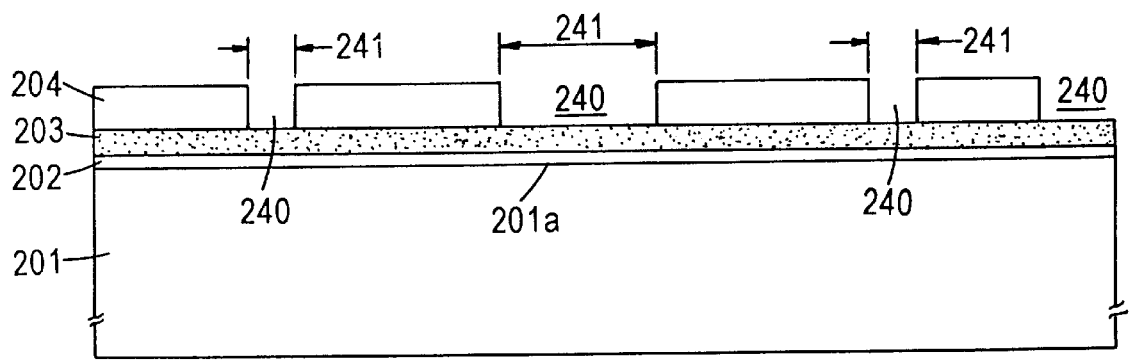
Figure 2D:
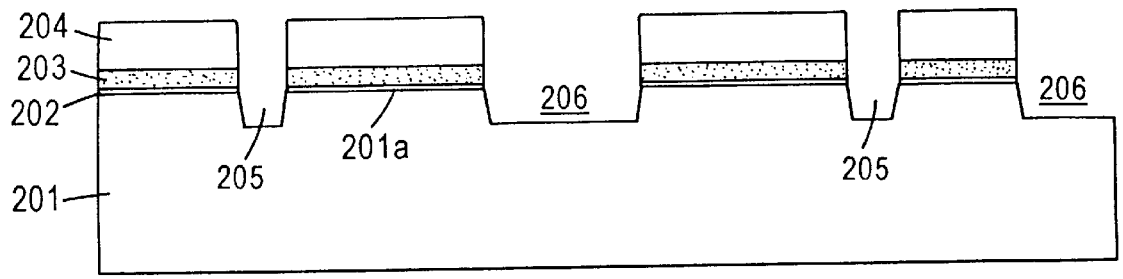

A photoresist source/drain mask 204 is then formed on polish stop layer 203, as shown in FIG. 2C. Photoresist source/drain mask 204 has a pattern defined by openings 240, which generally have a width 241 substantially corresponding to the width of the subsequently formed trenches at the main surface 201a of the substrate 201. The polish stop layer 203 is then etched away, and the etching continues through the pad oxide layer 202 and into the substrate 201 to form the shallow trenches 205, 206, as shown in FIG. 2D. The trench openings 205, 206 vary in width, each opening 206 having a width at main surface 201a greater than the width at main surface 201a of openings 205. The trenches 205, 206 are typically etched to a depth of up to about 4000Å. In practicing the present invention, a trench depth of about 2500Å to about 3000Å has been found particularly suitable. When the etching of the trenches 205, 206 is completed, the photoresist 204 is stripped off the polish stop layer 203.

Figure 2E:
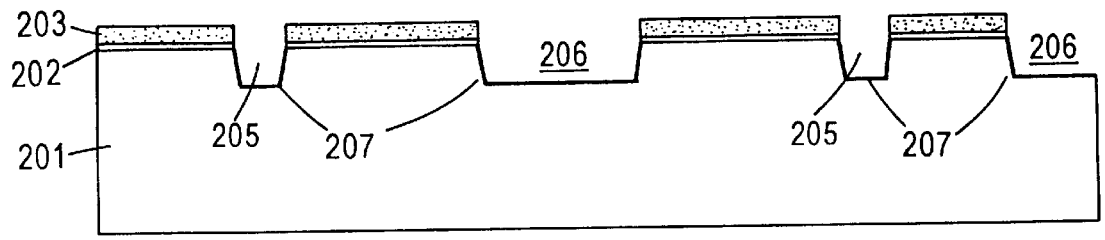
Figure 2F:
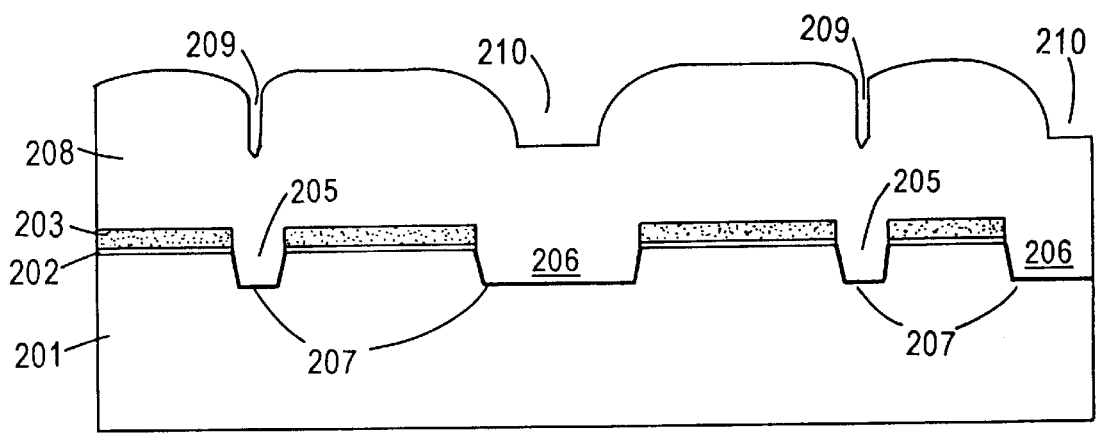

Thereafter, the surface of the trenches 205, 206 is thermally oxidized to form an oxide liner 207 on the inner surface of trenches 205, 206, typically at a temperature of about 1000° C. or higher. FIG. 2E shows the trenches 205, 206 with the completed liners 207. Subsequent to formation of the oxide liner 207, trenches 205, 206 are filled with a first layer of a suitable insulating material 208, as shown in FIG. 2F. Such insulating material 208 can comprise silicon dioxide derived from TEOS by LPCVD or derived from silane by LPCVD. The trenches 205, 206 can also be filled with a high density plasma (HDP) oxide, preferably employing the methodology disclosed in copending application Ser. No. 08/924,133, filed Sep. 5, 1997 (Attorney Docket No. 1033-352), the entire disclosure of which is hereby incorporated herein by reference. Due to the nature of the insulating material, after deposition the first layer of insulating material 208 has a seam 209 above each of the small trenches 205 and has a step 210 above each of the large trenches 206.

Figure 2G:
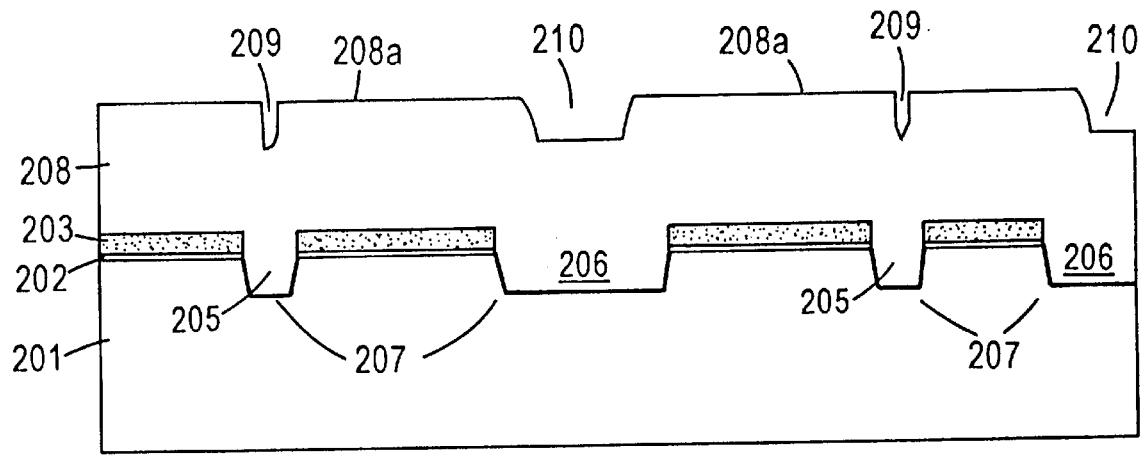

Subsequent to trench filling the first layer of insulating material 208 is polished, as by CMP, to partially planarize it as shown in FIG. 2G. Polishing is typically carried out until the upper surface 208a of the first layer of insulating material 208 above the small trenches 205 is substantially planarized. After this initial polishing step, the seams 209 and the steps 210 still exist, but the extremes of the topography of the first layer of insulating material 208 are removed, and the first layer of insulating material 208 above the small trenches 205 is substantially flat.

Figure 2H:
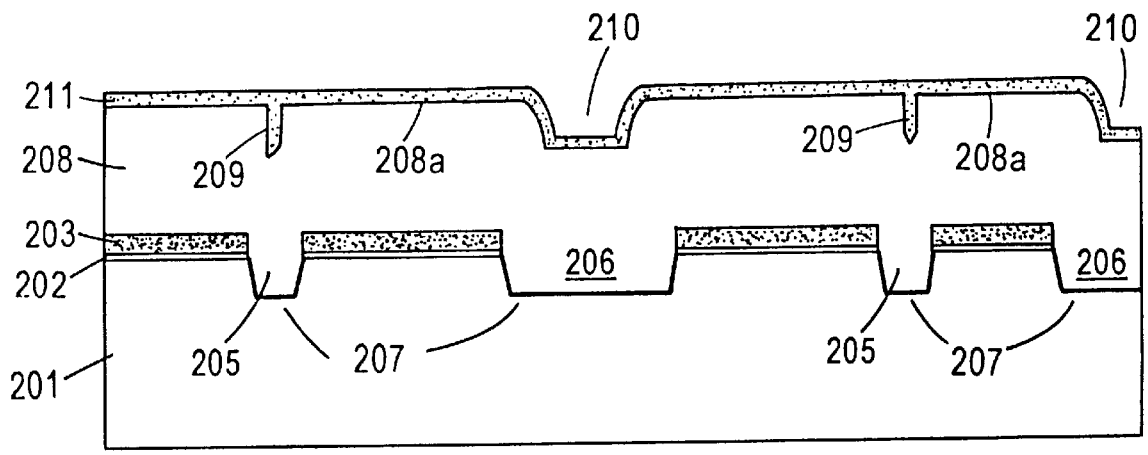

Next, referring to FIG. 2H, a second layer of insulating material 211 is deposited to fill the seams 209 over the small trenches 205, using any of the techniques and materials discussed in reference to the deposition of the initial layer of insulating material 208. This second layer of insulating material 211 is much thinner than the first layer of insulating material 208, because its only purpose is to fill the seams 209. Since the deposition of the second layer of insulating material 211 takes place on a partially planar surface 208a, no new seams are created; rather, the seams 209 are filled in. A portion of the steps 210 is also filled.

Figure 2I:
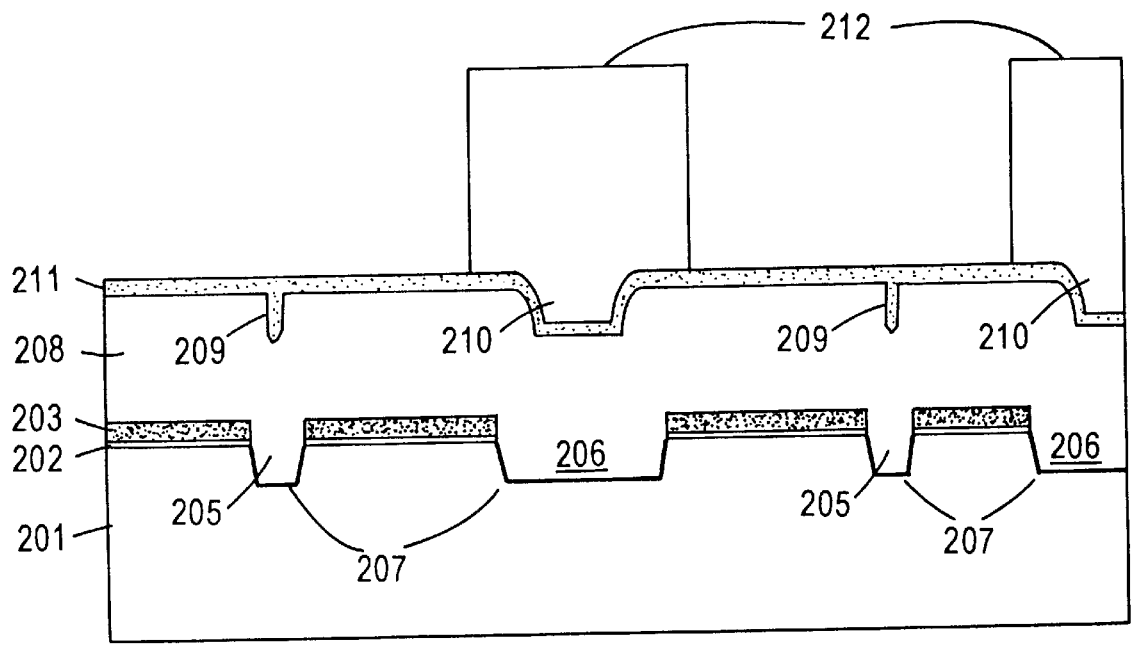
Figure 2J:
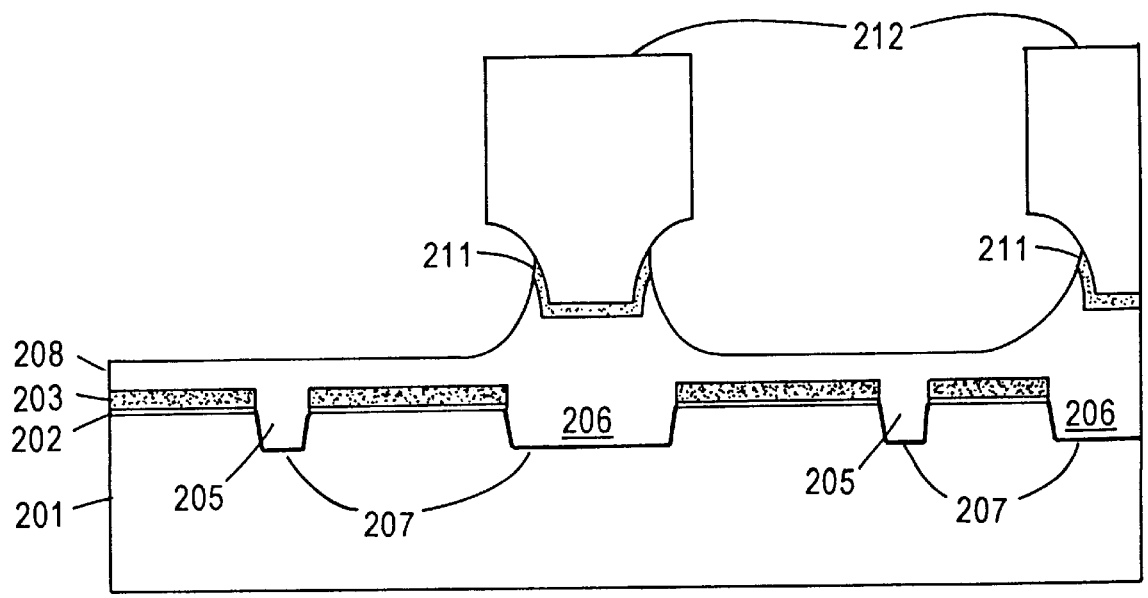
Figure 2K:
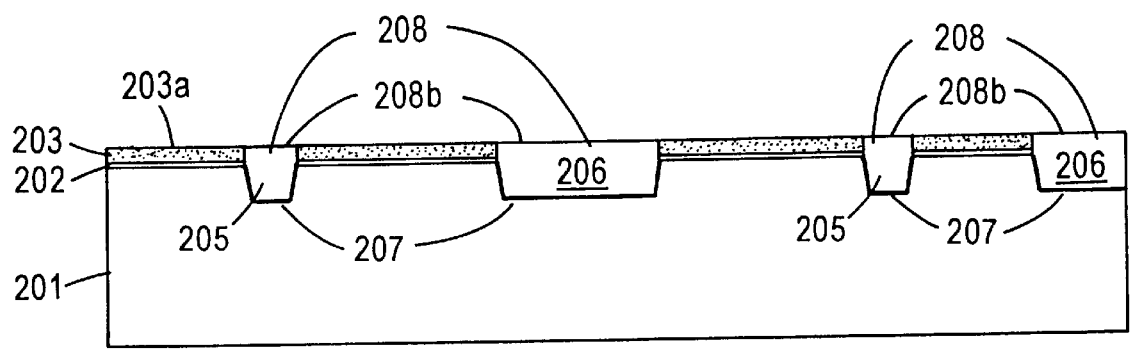

After deposition of the second layer of insulating material 211, a photoresist planarization mask 212 is formed on the second layer of insulating material 211 masking the steps above the large trenches 206 and exposing filled-in seams 209, as shown in FIG. 2I. The seams 209 do not need to be protected from overetching by a mask because they have been filled in by the second layer of insulating material 211. The second layer of insulating material 211 and the first layer of insulating material 208 are isotropically etched, as shown in FIG. 2J, to remove most of the insulating material over the polish stop layer 302 and the small trenches 205. The planarization mask 212 is then removed, and the remaining insulating material of layers 208 and 211 is polished, as by CMP, such that the upper surface 208b of the insulating material 208 is substantially flush with the upper surface 203a of the polish stop layer 203, as depicted in FIG. 2K.

Deposition of the second layer of insulating material to fill and effectively eliminate the seams 209 in accordance with the present invention enables the use of a planarization mask 212 which is simpler to fabricate and employ than reverse source/drain planarization masks, since it is only necessary to protect the thinner insulating material over the large trenches 206. The inventive planarization mask 212 is generated by a relatively simpler algorithm than the reverse source/drain masks, since it is not necessary to locate and protect small features, like seams 209. Moreover, because only larger and less numerous areas, such as large trenches 206, are masked, the planarization mask 212 is relatively easy to use; e.g., it is easier to alien, etc. Still further, since the insulating material is partially removed during the first polish, the duration and extent of the subsequent etching and polishing steps are reduced. Thus, the present invention including the use of the planarization mask 212 provides an increase in production throughput and an attendant economic benefit. The present invention is applicable to the manufacture of various types of semiconductor devices having STI, particularly high density semiconductor devices having a design rule of about $0.25\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having a plurality of trenches formed in a semiconductor substrate or in an epitaxial layer on the semiconductor substrate, which method comprises, sequentially:

forming a pad oxide layer on a main surface of the substrate or epitaxial layer;

forming a polish stop layer having an upper surface on the pad oxide layer;

forming a large trench and a small trench, the large trench having a width at the main surface greater than a width at the main surface of the substrate of the small trench;

depositing a first layer of an insulating material to fill the trenches and cover the polish stop layer, whereby the first insulating layer has a seam above the small trench;

performing a first polish to substantially planarize a portion of the first layer of the insulating material above the small trench;

depositing a second layer of the insulating material filling the seam;

masking the large trench with a planarization mask having an opening above the small trench;

etching to remove a portion of each of the first and second layers of the insulating material above the small trench;

removing the planarization mask; and performing a second polish to planarize such that the upper surface of the first layer of the insulating material in the large and small trenches is substantially flush with the upper surface of the polish stop layer.

2. The method according to claim 1, comprising:

providing a source/drain mask on the polish stop layer, the source/drain mask containing a pattern having a plurality of openings;

etching to remove portions of the underlying polish stop and pad oxide layers and to form the trenches; and thermally growing an oxide layer lining each trench.

3. The method according to claim 2, wherein the pad oxide layer comprises silicon oxide and the polish stop layer comprises silicon nitride.

4. The method according to claim 2, wherein the source/drain mask and the planarization mask each comprises a photoresist mask.

5. The method according to claim 3, wherein each opening in the source/drain mask has a width substantially equal to the width of one of the plurality of trenches at the main surface.

6. The method according to claim 5, wherein the plurality of trenches are each etched to a depth of up to about 4000 Å.

7. The method according to claim 6, wherein the plurality of trenches are each etched to a depth of about 2500 Å to about 3000 Å.

8. The method according to claim 3, comprising heating at a temperature of at least about 1000° C. to thermally grow a silicon oxide liner.

9. The method according to claim 3, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

10. The method according to claim 9, comprising polishing the first and second layers of the insulating material by chemical-mechanical polishing.

11. The method according to claim 9, comprising isotropically etching the first and second layers of the insulating material.

12. The method according to claim 1, wherein the first insulating layer has a step above the large trench.

13. The method according to claim 12, comprising masking the step prior to etching.

14. A method of manufacturing an integrated circuit, comprising sequentially:

forming a silicon oxide pad layer on a main surface of the substrate or an epitaxial layer formed on the substrate;

forming a silicon nitride polish stop layer having an upper surface on the silicon oxide pad layer;

providing a photoresist source/drain mask on the silicon nitride polish stop layer, the source/drain mask containing a pattern having a plurality of openings;

etching to remove portions of the underlying nitride polish stop and pad oxide layers and to form a large trench and a small trench, the large trench having a width at the main surface greater than a width at the main surface of the small trench;

thermally growing a thin silicon oxide layer lining each trench;

depositing a first layer of an insulating material to fill the trenches and cover the silicon nitride polish stop layer, the first layer of the insulating material comprising silicon dioxide derived from tetraethyl orthosilicate (TEOS) by low pressure chemical vapor deposition (LPCVD), silicon dioxide derived from silane by LPCVD, or a high density plasma oxide, whereby the first layer of the insulating material has a seam above the small trench;

performing a first polish by chemical-mechanical polishing (CMP) to substantially planarize a portion of the first layer of the insulating material above the small trench;

depositing a second layer of the insulating material to fill the seam and to cover the upper surface of the first layer of the insulating material, the second layer of the insulating material comprising silicon dioxide derived from tetraethyl orthosilicate (TEOS) by low pressure chemical vapor deposition (LPCVD), silicon dioxide derived from silane by LPCVD, or a high density plasma oxide;

masking the large trench with a photoresist planarization mask having an opening above the small trench;

isotropically etching to remove a portion of each of the first and second layers of the insulating material above the silicon nitride polish stop layer and the small trench;

removing the planarization mask; and performing a second polish by CMP to planarize such that the upper surface of the first layer of the insulating material in the large and small trenches is substantially flush with the upper surface of the silicon nitride polish stop layer.

* * * * *